United States Patent
Wang

(10) Patent No.: US 12,219,848 B2
(45) Date of Patent: Feb. 4, 2025

(54) DISPLAY PANEL

(71) Applicant: Wuhan China Star Optoelectronics Semiconductor Display Technology Co., Ltd., Hubei (CN)

(72) Inventor: Haoran Wang, Hubei (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 17/600,140

(22) PCT Filed: Sep. 13, 2021

(86) PCT No.: PCT/CN2021/117894
§ 371 (c)(1),
(2) Date: Sep. 30, 2021

(87) PCT Pub. No.: WO2023/029076
PCT Pub. Date: Mar. 9, 2023

(65) Prior Publication Data
US 2024/0032373 A1    Jan. 25, 2024

(30) Foreign Application Priority Data
Aug. 31, 2021   (CN) .......................... 202111016088.2

(51) Int. Cl.
*H01L 27/12* (2006.01)
*H10K 59/35* (2023.01)
*H10K 59/80* (2023.01)

(52) U.S. Cl.
CPC ......... *H10K 59/353* (2023.02); *H10K 59/873* (2023.02); *H10K 59/879* (2023.02)

(58) Field of Classification Search
CPC ...... H01L 27/1218; H10K 59/352–353; H10K 59/87–8731; H10K 59/879–8791
See application file for complete search history.

(56) References Cited

U.S. PATENT DOCUMENTS

| | | | |
|---|---|---|---|
| 8,648,361 B2 * | 2/2014 | Lee ...................... | H10K 50/854 257/89 |
| 11,716,888 B2 * | 8/2023 | Tang ...................... | H10K 71/00 257/40 |

(Continued)

FOREIGN PATENT DOCUMENTS

| CN | 109148723 | 1/2019 |
|---|---|---|
| CN | 110164938 | 8/2019 |

(Continued)

OTHER PUBLICATIONS

Refractiveindex.info. Refractive index of Si3N4, SiN (Silicon nitride)—Vogt—1.91. (n.d.). https://refractiveindex.info/?shelf=main&book=Si3N4&page=Vogt-1.91 (Year: 2015).*

(Continued)

*Primary Examiner* — Bryan R Junge
*Assistant Examiner* — Mario Andres Autore, Jr.

(57) ABSTRACT

The present invention provides a display panel, including a substrate (including a flat region and a curved region), a plurality of sub-pixels (including a first sub-pixel, a second sub-pixel, and a third sub-pixel), a packaging layer covering the plurality of sub-pixels, and an optical film layer. The optical film layer includes a plurality of condensation regions and a plurality of transmission regions, the plurality of condensation regions include a first condensation region located on the curved region and disposed corresponding to the first sub-pixel, and the plurality of transmission regions include a first transmission region located on the flat region and disposed corresponding to the first sub-pixel.

13 Claims, 3 Drawing Sheets

(56) References Cited

U.S. PATENT DOCUMENTS

| | | | |
|---|---|---|---|
| 2013/0016313 A1* | 1/2013 | Shim | G02B 5/22 |
| | | | 359/891 |
| 2014/0312319 A1 | 10/2014 | Kim | |
| 2016/0226029 A1* | 8/2016 | Lee | H10K 59/38 |
| 2018/0076270 A1* | 3/2018 | Kwon | H10K 59/124 |
| 2018/0095570 A1* | 4/2018 | Hong | H10K 59/873 |
| 2019/0074331 A1* | 3/2019 | Oh | H10K 59/80515 |
| 2020/0203445 A1 | 6/2020 | Ou et al. | |
| 2020/0266392 A1* | 8/2020 | Lee | H10K 59/40 |
| 2020/0321406 A1* | 10/2020 | Lee | H10K 59/40 |
| 2021/0074939 A1* | 3/2021 | Jung | H10K 85/30 |
| 2021/0183971 A1* | 6/2021 | Kim | H10K 50/844 |
| 2021/0193741 A1* | 6/2021 | Chen | H10K 59/38 |

FOREIGN PATENT DOCUMENTS

| | | | | |
|---|---|---|---|---|
| CN | 110429126 | | 11/2019 | |
| CN | 110429126 A | * | 11/2019 | H01L 27/3211 |
| CN | 111628107 | | 9/2020 | |
| CN | 112038369 | | 12/2020 | |
| CN | 112038370 | | 12/2020 | |
| CN | 113066828 | | 7/2021 | |
| CN | 113161406 | | 7/2021 | |
| CN | 112038370 B | * | 7/2022 | H01L 27/3232 |
| KR | 102211928 B1 | * | 2/2021 | |

OTHER PUBLICATIONS

Refractiveindex.info. Refractive index of SiO2 (Silicon dioxide, Silica, Quartz)—Malitson. (1998). https://refractiveindex.info/?shelf=main&book=SiO2&page=Malitson#google_vignette (Year: 1998).*

Inc., K. S. (n.d.). Polyisoprene, CIS. https://www.krackeler.com/catalog/sigma/ALDRICH/431265.*

* cited by examiner

DISPLAY PANEL

RELATED APPLICATIONS

This application is a National Phase of PCT Patent Application No. PCT/CN2021/117894 having International filing date of Sep. 13, 2021, which claims the benefit of priority of Chinese Patent Application No. 202111016088.2 filed on Aug. 31, 2021. The contents of the above applications are all incorporated by reference as if fully set forth herein in their entirety.

FIELD AND BACKGROUND OF THE INVENTION

The present invention relates to display technologies, and more particularly, to a display panel.

In the current display field, organic light-emitting diode (OLED) curved screens are increasingly widely applied. Particularly, the design of the edge portion of the display screen in a shape of an arc is widely used in display screens nowadays.

In a large-angle curved screen, the curved region emits light at a large viewing angle relative to a front observation point. At a large viewing angle, attenuation of green light is lower, leading to a problem that the curved region looks greenish.

SUMMARY OF THE INVENTION

An objective of the present invention is to provide a display panel, aimed to reduce luminance of a first sub-pixel on a curved region at a large viewing angle, to reduce a phenomenon that the screen curved region looks greenish when the first sub-pixel is a green sub-pixel.

The present invention provides a display panel, including:
a substrate, including a flat region and a curved region;
a plurality of sub-pixels located on the substrate, wherein the plurality of sub-pixels are distributed on the flat region and the curved region, and the plurality of sub-pixels include a first sub-pixel, a second sub-pixel, and a third sub-pixel;
a packaging layer covering the plurality of sub-pixels; and
an optical film layer located on the packaging layer, wherein the optical film layer includes a plurality of condensation regions and a plurality of transmission regions, the plurality of condensation regions include a first condensation region located on the curved region and disposed corresponding to the first sub-pixel, and the plurality of transmission regions include a first transmission region located on the flat region and disposed corresponding to the first sub-pixel.

Further preferably, an area of the first sub-pixel is smaller than an area of the second sub-pixel, and the area of the first sub-pixel is smaller than an area of the third sub-pixel; and
the plurality of transmission regions further include a second transmission region and a third transmission region located on the curved region and respectively disposed corresponding to the second sub-pixel and the third sub-pixel.

Further preferably, an area of the first sub-pixel is smaller than an area of the second sub-pixel, and the area of the first sub-pixel is smaller than an area of the third sub-pixel;
the plurality of transmission regions further include a second transmission region and a third transmission region located on the curved region and respectively disposed corresponding to the second sub-pixel and the third sub-pixel; and the plurality of condensation regions further include a fourth condensation region and a fifth condensation region located on the curved region and respectively disposed corresponding to the second sub-pixel and the third sub-pixel, wherein
the fourth condensation region is disposed between the second transmission region and the flat region, and a size of the fourth condensation region increases gradually in a direction approaching the flat region;
the fifth condensation region is disposed between the third transmission region and the flat region, and a size of the fifth condensation region increases gradually in the direction approaching the flat region; and
a size of the first condensation region increases gradually in the direction approaching the flat region.

Further preferably, the plurality of condensation regions further include a second condensation region and a third condensation region located on the flat region and respectively disposed corresponding to the second sub-pixel and the third sub-pixel.

Further preferably, the first sub-pixel generates a green light source.

Further preferably, the optical film layer includes:
a pattern layer located on the packaging layer, wherein the pattern layer includes grooves disposed corresponding to the condensation regions; and
a planarization layer covering the pattern layer, wherein the planarization layer includes filling structures disposed corresponding to the grooves, and a refractive index of the planarization layer is greater than a refractive index of the pattern layer.

Further preferably, the refractive index of the pattern layer ranges from 1.3 to 1.6, and the refractive index of the planarization layer ranges from 1.5 to 1.9.

Further preferably, a projection shape of the sub-pixel on the substrate is same as a projection shape of the corresponding filling structure on the substrate.

Further preferably, the shape of the sub-pixel includes one of a four-angle star, an ellipsoid, a diamond, a square, a circle, and a long stick; and
the shape of the filling structure in a looking down direction is a circle, and a diameter of the filling structure is greater than a diameter of an inscribed circle of the corresponding sub-pixel and is less than a diameter of a circumscribed circle of the corresponding sub-pixel.

Further preferably, the optical film layer includes:
a pattern layer located on the packaging layer, wherein the pattern layer includes bumps disposed corresponding to the condensation regions; and
a planarization layer covering the pattern layer, wherein a refractive index of the planarization layer is less than a refractive index of the pattern layer.

Further preferably, the second sub-pixel generates a red light source.

Further preferably, the third sub-pixel generates a blue light source.

Further preferably, the pattern layer includes a first groove in the first condensation region, and the planarization layer includes a first filling structure filling the first groove.

Further preferably, the pattern layer includes a first bump in the first condensation region.

Further preferably, the pattern layer and the planarization layer are made of transparent materials.

The present invention provides a display panel, including a substrate, a plurality of sub-pixels located on the substrate, a packaging layer covering the plurality of sub-pixels, and an optical film layer located on the packaging layer. The substrate includes a flat region and a curved region, the plurality of sub-pixels are distributed on the flat region and the curved region and include a first sub-pixel, a second sub-pixel, and a third sub-pixel. The optical film layer includes a plurality of condensation regions and a plurality of transmission regions, the plurality of condensation regions include a first condensation region located on the curved region and disposed corresponding to the first sub-pixel, and the plurality of transmission regions include a first transmission region located on the flat region and disposed corresponding to the first sub-pixel. The curved region emits light at a large angle, the first condensation region may converge light emitted by the first sub-pixel on the curved region to a small angle, to reduce luminance of the first sub-pixel on the curved region at a large viewing angle, and when the first sub-pixel is a green sub-pixel, a phenomenon that the curved region looks greenish may be reduced.

BRIEF DESCRIPTION OF THE SEVERAL VIEWS OF THE DRAWINGS

The following describes specific implementations of the present invention in detail with reference to the accompanying drawings, to make the technical solutions and other beneficial effects of the present invention obvious.

DESCRIPTION OF SPECIFIC EMBODIMENTS OF THE INVENTION

Figure 1:
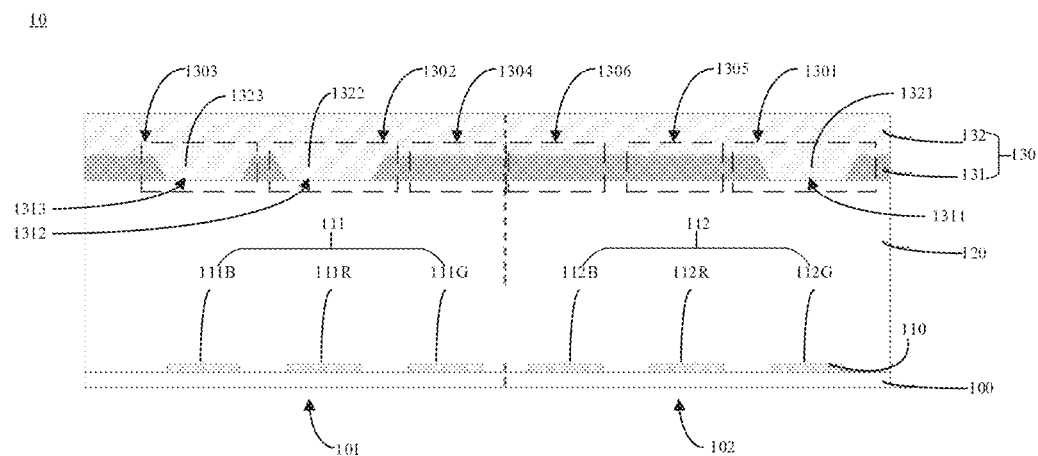
FIG. 1 is a schematic diagram of a sectional structure of a display panel according to a first embodiment of the present invention.

The technical solutions of the embodiments of the present invention are clearly and completely described in the following with reference to the accompanying drawings of the embodiments of the present invention. Apparently, the described embodiments are merely some rather than all of the embodiments of the present invention. All other embodiments obtained by a person skill in the art based on the embodiments of the present invention without creative efforts shall fall within the protection scope of the present invention.

In descriptions of the present invention, it should be understood that the terms such as "first" and "second" are used only for the purpose of description, and should not be understood as indicating or implying the relative importance or implicitly specifying the quantity of the indicated technical features. Thus, features defined by "first" and "second" may explicitly or implicitly include one or more of the features. In the descriptions of the present invention, unless otherwise explicitly specified, "a plurality of" means two or more than two.

In the present invention, unless otherwise explicitly stipulated and restricted, that a first feature is "on" or "under" a second feature may include that the first and second features are in direct contact, or may include that the first and second features are not in direct contact but in contact by using other features therebetween. Moreover, the first feature being "over", "above", and "on" the second feature includes that the first feature is directly above or obliquely above the second feature, or merely means that the first feature has a larger horizontal height than the second feature. That the first feature is "below", "under", and "underneath" the second feature includes that the first feature is right below the second feature and is not right below the second feature, or merely represents that a horizontal height of the first feature is lower than that of the second feature.

Many different implementations or examples are provided in the following disclosure to implement different structures of the present invention. To simplify the disclosure of the present invention, components and settings in particular examples are described below. Certainly, they are merely examples and are not intended to limit the present invention. In addition, in the present invention, reference numerals and/or reference letters may be repeated in different examples. The repetition is for the purposes of simplification and clearness, and a relationship between various discussed implementations and settings is not indicated. Moreover, the present invention provides examples of various particular processes and materials, but a person of ordinary skill in the art may be aware of application of another process and/or use of another material.

Referring to FIG. 1, FIG. 1 is a schematic diagram of a sectional structure of a display panel according to a first embodiment of the present invention. The display panel 10 includes a substrate 100, a plurality of sub-pixels 110 located on the substrate 100, a packaging layer 120 covering the plurality of sub-pixels 110, and an optical film layer 130 located on the packaging layer 120. The substrate 100 includes a flat region 101 and a curved region 102, and the plurality of sub-pixels 110 are distributed on the flat region 101 and the curved region 102. That is, the plurality of sub-pixels 110 include flat region sub-pixels 111 located on the flat region 101 and curved region sub-pixels 112 located on the curved region 102. The flat region sub-pixels 111 include a first flat region sub-pixel 111G, a second flat region sub-pixel 111R, and a third flat region sub-pixel 111B, and the curved region sub-pixels 112 include a first curved region sub-pixel 112G, a second curved region sub-pixel 112R, and a third curved region sub-pixel 112B. In this embodiment, a first sub-pixel (G) is a green sub-pixel, a second sub-pixel (R) is a red sub-pixel, and a third sub-pixel (B) is a blue sub-pixel. That is, the first sub-pixel (G) generates a green light source, the second sub-pixel (R) generates a red light source, and the third sub-pixel (B) generates a blue light source. An area of the first sub-pixel (G) is smaller than an area of the second sub-pixel (R), and the area of the first sub-pixel (G) is smaller than an area of the third sub-pixel (B).

In terms of functions, the optical film layer 130 includes a plurality of condensation regions and a plurality of transmission regions, and the plurality of condensation regions include: a first condensation region 1301 corresponding to the above of the first curved region sub-pixel 112G; a second condensation region 1302 corresponding to the second flat region sub-pixel 111R; and a third condensation region 1303 corresponding to the third flat region sub-pixel 111B. The plurality of transmission regions include: a first transmission region 1304 corresponding to the first flat region sub-pixel 111G; a second transmission region 1305 corresponding to the second curved region sub-pixel 112R; and a third transmission region 1306 corresponding to the third curved region sub-pixel 112B.

In terms of manufacturing methods, the optical film layer 130 includes a pattern layer 131 located on the packaging layer 120, wherein the pattern layer 131 includes grooves disposed corresponding to the condensation regions; and a planarization layer 132 covering the pattern layer 131, wherein the planarization layer 132 includes filling structures disposed corresponding to the grooves. Described in detail, the pattern layer 131 includes a first groove 1311 in the first condensation region 1301, a second groove 1312 in the second condensation region 1302, and a third groove 1313 in the third condensation region 1303. The planarization layer 132 includes a first filling structure 1321 filling the first groove 1311, a second filling structure 1322 filling the second groove 1312, and a third filling structure 1323 filling the third groove 1313. In this embodiment, a refractive index of the planarization layer 132 is greater than a refractive index of the pattern layer 131. Described in detail, the refractive index of the pattern layer 131 may range from 1.3 to 1.6, and the refractive index of the planarization layer 132 may range from 1.5 to 1.9. The pattern layer 131 and the planarization layer 132 are both made of transparent materials. The pattern layer 131 includes, but is not limited to, epoxy and acrylic organic materials and inorganic materials such as SiO2 and SiON. The planarization layer 132 includes, but is not limited to organic materials doped with nano particles such as ZrO2 and TiO2, and organic-inorganic hybrid materials such as metal polydimethylsiloxane.

The pattern layer 131 and the planarization layer 132 in the first transmission region 1304, the second transmission region 1305, and the third transmission region 1306 are flat, namely, do not include a groove or a filling structure. Therefore, a light convergence effect of the first transmission region 1304, the second transmission region 1305, and the third transmission region 1306 is less than that of the first condensation region 1301, the second condensation region 1302, and the third condensation region 1303, and light directly transmits the first transmission region 1304, the second transmission region 1305, and the third transmission region 1306.

It should be noted that, the first groove 1311, the second groove 1312, and the third groove 1313 are in a shape of an inverted trapezoid, so that the first filling structure 1321, the second filling structure 1322, and the third groove 1313 are all in a shape of an inverted trapezoid. That is, the filling structure includes an upper surface and a lower surface. The upper surface and the lower surface have the same shape but different sizes. Therefore, "a shape of the filling structure" mentioned below may refer to a shape of the upper surface or a shape of the lower surface, and "a size of the filling structure" mentioned below may be subject to a size of the lower surface.

In this embodiment, light may be converged only when two media with different refractive indexes are combined. The first condensation region 1301 includes the first filling structure 1321 and the pattern layer 131 adjacent to the first filling structure 1321, the second condensation region 1302 includes the second filling structure 1322 and the pattern layer 131 adjacent to the second filling structure 1322, and the third condensation region 1303 includes the third filling structure 1323 and the pattern layer 131 adjacent to the third filling structure 1323.

Figure 2A:
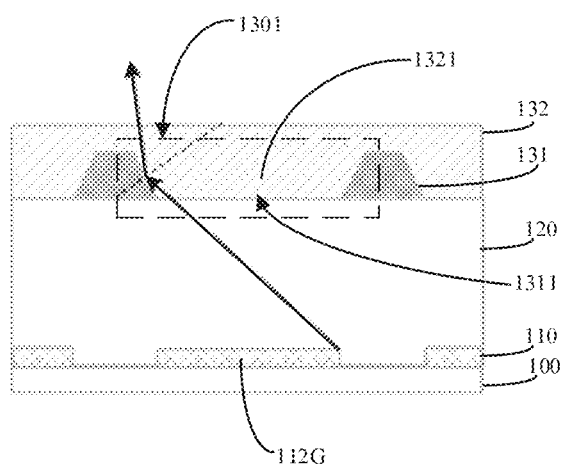
FIG. 2*a* is a diagram of a light convergence principle according to a first embodiment of the present invention.

Referring to FIG. 2a, FIG. 2a is a diagram of a light convergence principle according to a first embodiment of the present invention. Using the first curved region sub-pixel 112G as an example, light emitted by the first curved region sub-pixel 112G is converged through the first condensation region 1301. Described in detail, incident light reaches the adjacent pattern layer 131 through the first filling structure 1321, since a refractive index of the first filling structure 1321 in the planarization layer 132 is greater than the refractive index of the pattern layer 131, the incident light may be totally reflected at an intersection plane of the first filling structure 1321 and the pattern layer 131, so that the light is converged to a small angle.

Figure 2B:
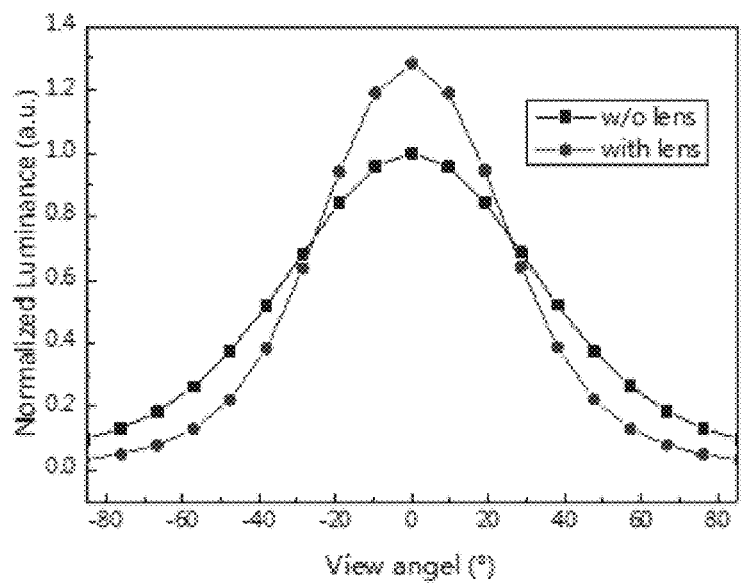
FIG. 2*b* is a line chart of normalized luminance and a light emitting angle according to a first embodiment of the present invention.

Referring to FIG. 2b, FIG. 2b is a line chart of normalized luminance and a light emitting angle according to a first embodiment of the present invention. A horizontal coordinate is a light emitting angle, and a longitudinal coordinate is normalized luminance. Using the first curved region sub-pixel 112G in FIG. 2a as an example, a square broken line represents a relationship between the light emitting angle and the normalized luminance without the first condensation region 1301, and a circular broken line represents a relationship between the light emitting angle and the normalized luminance with the first condensation region 1301. As can be seen, after the first condensation region 1301 is added, luminance of light emitted at a large angle is reduced, and luminance of light emitted at a small angle is increased, which is equivalent to reducing luminance of light emitted at a large angle by the first curved region sub-pixel 112G corresponding to the first condensation region 1301, namely, reducing luminance of the first curved region sub-pixel 112G at a large viewing angle, thereby reducing a phenomenon that the curved region 102 looks greenish. Similarly, for the second flat region sub-pixel 111R and the third flat region sub-pixel 111B, the flat region 101 emits light at a small viewing angle, the second condensation region 1302 converges light emitted by the second flat region sub-pixel 111R to a small angle, and the third condensation region 1303 converges light emitted by the third flat region sub-pixel 111B to a small angle, thereby increasing luminance of red light and blue light of the flat region 101.

Due to pixel materials, blue light is the weakest, red light is stronger, and green light is the strongest. Therefore, a size of the second sub-pixel may be designed to be the largest, a size of the third sub-pixel ranks second, and a size of the first sub-pixel is the smallest, to increase luminance of red light and blue light, and reduce luminance differences among red light, blue light, and green light. In this embodiment, by disposing the second condensation region 1302 above the corresponding second flat region sub-pixel 111R and disposing the third condensation region 1303 above the corresponding third flat region sub-pixel 111B, luminance of the second flat region sub-pixel 111R and the third flat region sub-pixel 111B may be further increased, thereby reducing the luminance differences with green light.

Figure 3:
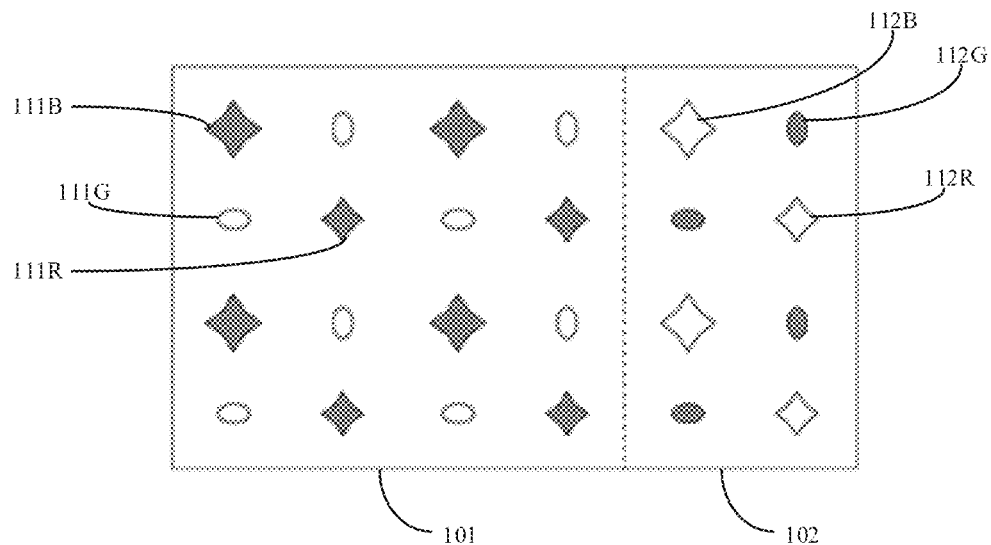
FIG. 3 is a schematic top view of sub-pixel distribution according to a first embodiment of the present invention.

Referring to FIG. 3, FIG. 3 is a schematic top view of sub-pixel distribution according to a first embodiment of the present invention. Each graph represents one sub-pixel, wherein a blank graph represents that the sub-pixel has no first filling structure, no second filling structure, or no third filling structure above the sub-pixel; and a shadow graph represents that the sub-pixel has a first filling structure, a second filling structure, or a third filling structure above the sub-pixel, and the shadow graph represents a shape and a size of the first filling structure 1321, the second filling structure 1322, or the third filling structure 1323. A projection shape of each sub-pixel on the substrate is same as a projection shape of a corresponding filling structure on the substrate. Shapes of the first sub-pixel, the second sub-pixel, and the third sub-pixel may respectively include one of a four-angle star, an ellipsoid, a diamond, a square, a circle, and a long stick. In this embodiment, the shape of the third sub-pixel is a large four-angle star, the shape of the second sub-pixel is a small four-angle star, and the shape of the first sub-pixel is an ellipsoid. The shape and the size of the first filling structure 1321 are same as the shape and the size of the first sub-pixel, the shape and the size of the second filling structure 1322 are same as the shape and the size of the second sub-pixel, and the shape and the size of the third filling structure 1323 are same as the shape and the size of the third sub-pixel. In some embodiments, the sub-pixel may be in another shape, and the sub-pixels may be arranged in another arrangement manner.

The first condensation region 1301 is disposed above the first curved region sub-pixel 112G, so that the first filling structure 1321 exists above the first curved region sub-pixel 112G, and the first filling structure 1321 (a shadow part) perfectly coincides with the first curved region sub-pixel 112G in a top view. Transmission regions exist above the second curved region sub-pixel 112R and the third curved region sub-pixel 112B, and there is no filling structure, so that no shadow part exists in the second curved region sub-pixel 112R and the third curved region sub-pixel 112B. Shadow graphs exist in the second flat region sub-pixel 111R and the third flat region sub-pixel 111B, and no shadow graph exists in the first flat region sub-pixel 111G, so that the second filling structure 1322 exists above the second flat region sub-pixel 111R, the third filling structure 1323 exists above the third flat region sub-pixel 111B, and no filling structure exists above the first flat region sub-pixel 111G.

Figure 4:
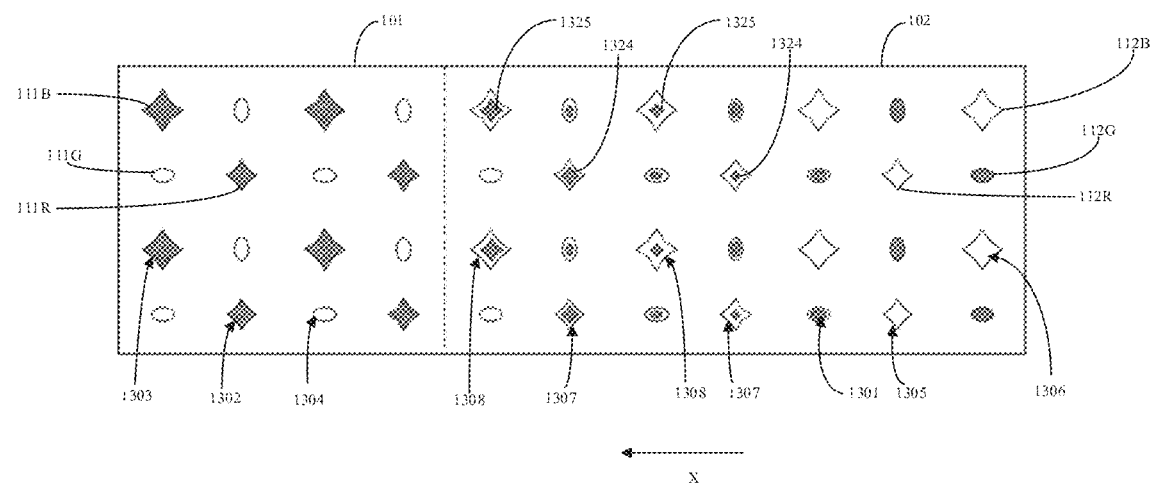
FIG. 4 is a schematic top view of sub-pixel distribution according to a second embodiment of the present invention.

Referring to FIG. 4, FIG. 4 is a schematic top view of sub-pixel distribution according to a second embodiment of the present invention. For ease of understanding and description, same structures in the second embodiment and the first embodiment use same numbers, and repeated structures are not described again. A difference between this embodiment and the first embodiment lies in that, the plurality of condensation regions further include a fourth condensation region 1307 and a fifth condensation region 1308 located on the curved region 102 and respectively disposed corresponding to the second sub-pixel 112R and the third sub-pixel 112B. The fourth condensation region 1307 is disposed between the second transmission region 1305 and the flat region 101, and a size of the fourth condensation region 1307 increases gradually in a direction (X) approaching the flat region 101. The fifth condensation region 1308 is disposed between the third transmission region 1306 and the flat region 101, and a size of the fifth condensation region 1308 increases gradually in the direction (X) approaching the flat region 101. A size of the first condensation region 1301 increases gradually in the direction (X) approaching the flat region 101. Sizes of a plurality of filling structures 1321 (shadow graphs) on the curved region 102 decrease gradually in the direction X corresponding to the first condensation region 1301. For example, first filling structures 1321 with same size as the first curved region sub-pixel 112G are disposed above two columns of first curved region sub-pixels 112G at a right edge (that is, shadow graphs completely fill blank graphs), and the size of the first filling structure 1321 becomes smaller in the direction X until no first filling structure 1321 is disposed on a column of first curved region sub-pixels 112G at a left edge (the size becomes 0). A larger size of the first filling structure 1321 indicates a stronger weakening effect on green light; and a smaller size of the first filling structure indicates a weaker weakening effect on green light. Since the phenomenon of looking greenish is more obvious as approaching the right edge of the curved region 102, such a gradually changed transitional size design may improve the uniformity of green light.

In this embodiment, the pattern layer 131 further includes a fourth groove corresponding to each second sub-pixel on the curved region 102 (that is, the pattern layer 131 includes a fourth groove in the second transmission region 1305) and a fifth groove corresponding to each third sub-pixel on the curved region 102 (that is, the pattern layer 131 includes a fifth groove in the third transmission region 1306). The planarization layer 132 further includes a fourth filling structure 1324 filling the fourth groove and a fifth filling structure 1325 filling the fifth groove. The fourth filling structure 1324 corresponds to the fourth condensation region 1307, and the fifth filling structure 1325 corresponds to the fifth condensation region 1308. Therefore, a size of the fourth filling structure 1324 increases gradually in the direction X, and a size of the fifth filling structure 1325 increases gradually in the direction X, thereby improving the uniformity of red light and blue light of the curved region 102.

Figure 5:
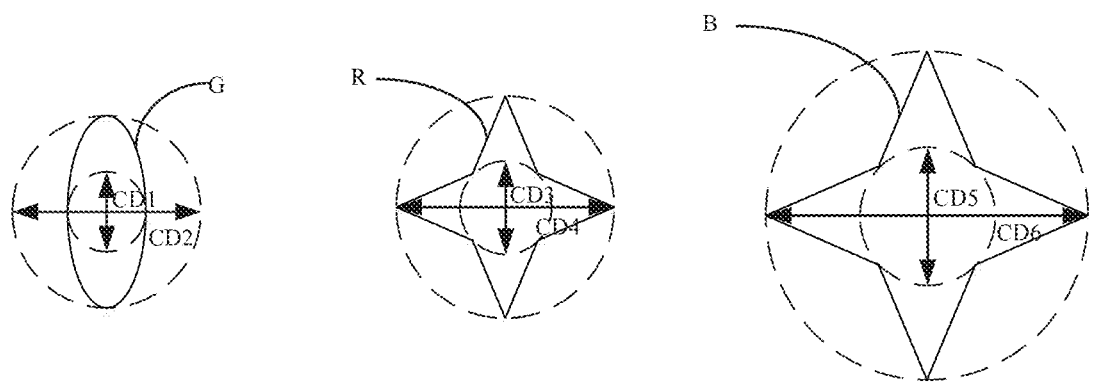
FIG. 5 is a schematic diagram of size comparison between a sub-pixel and a filling structure according to a third embodiment of the present invention.

Referring to FIG. 5, FIG. 5 is a schematic diagram of size comparison between a sub-pixel and a filling structure according to a third embodiment of the present invention. For ease of understanding and description, same structures in the third embodiment and the first embodiment use same numbers, and repeated structures are not described again. A difference between the third embodiment and the first embodiment lies in the shape of the filling structure. In FIG. 3, the shape of the filling structure is same as the shape of the sub-pixel. In this embodiment, the shape of the filling structure is different from the shape of the sub-pixel. That is, the first sub-pixel (G) is in a shape of an ellipsoid, the second sub-pixel (R) and the third sub-pixel (B) are in a shape of a four-angle star, and shapes of the first filling structure 1321, the second filling structure 1322, and the third filling structure 1323 in a looking down direction are a circle. A diameter of the filling structure is greater than a diameter of an inscribed circle of the corresponding sub-pixel and is less than a diameter of a circumscribed circle of the corresponding sub-pixel.

A diameter of the first filling structure 1321 is greater than a diameter (CD1) of an inscribed circle of the first sub-pixel (G) and is less than a diameter (CD2) of a circumscribed circle of the first sub-pixel (G). A diameter of the second filling structure 1322 is greater than a diameter (CD3) of an inscribed circle of the second sub-pixel (R) and is less than a diameter (CD4) of a circumscribed circle of the second sub-pixel (R). A diameter of the third filling structure 1323 is greater than a diameter (CD5) of an inscribed circle of the third sub-pixel (B) and is less than a diameter (CD6) of a circumscribed circle of the third sub-pixel (B).

Figure 6:
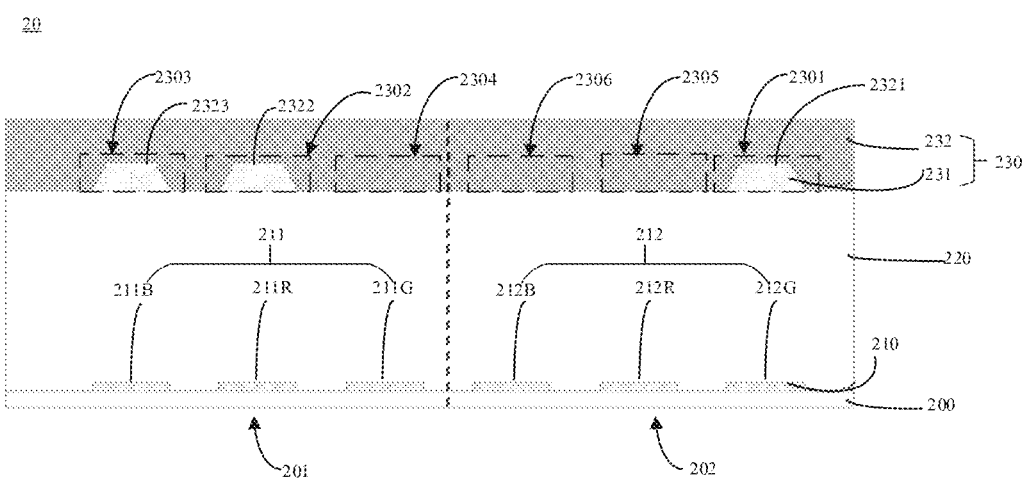
FIG. 6 is a schematic diagram of a sectional structure of a display panel according to a fourth embodiment of the present invention.

Referring to FIG. 6, FIG. 6 is a schematic diagram of a sectional structure of a display panel according to a fourth embodiment of the present invention. The display panel 20 includes a substrate 200, a plurality of sub-pixels 210 located on the substrate 200, a packaging layer 220 covering the plurality of sub-pixels 210, and an optical film layer 230 located on the packaging layer 220. The substrate 200 includes a flat region 201 and a curved region 202, and the plurality of sub-pixels 210 are distributed on the flat region 201 and the curved region 202. That is, the plurality of sub-pixels 210 include flat region sub-pixels 211 located on the flat region 201 and curved region sub-pixels 212 located on the curved region 202. The flat region sub-pixels 211 include a second flat region sub-pixel 211R, a first flat region sub-pixel 211G, and a third flat region sub-pixel 211B, and the curved region sub-pixels 212 include a second curved region sub-pixel 212R, a first curved region sub-pixel 212G, and a third curved region sub-pixel 212B.

The optical film layer 230 includes a plurality of condensation regions and a plurality of transmission regions, and the plurality of condensation regions include: a first condensation region 2301 corresponding to the first curved region sub-pixel 212G on the curved region 202; a second condensation region 2302 corresponding to the second flat region sub-pixel 212R on the flat region 201; and a third condensation region 2303 corresponding to the third flat region sub-pixel 212B on the flat region 201. The plurality of transmission regions include: a first transmission region 2304 located on the flat region 201 and corresponding to the first sub-pixel 211G; and a second transmission region 2305 and a third transmission region 2306 located on the curved region 202 and respectively corresponding to the second sub-pixel 212R and the third sub-pixel 212B.

Further, the optical film layer 230 includes a pattern layer 231 located on the packaging layer 220, wherein the pattern layer 231 includes bumps disposed corresponding to the condensation regions; and a planarization layer 232 covering the pattern layer 231. The pattern layer 231 includes a first bump 2321 in the first condensation region 2301, a second bump 2322 in the second condensation region 2302, and a third bump 2323 in the third condensation region 2303. A refractive index of the planarization layer 232 is less than a refractive index of the pattern layer 231. That is to say, the first condensation region 2301 includes the first bump 2321 and the planarization layer 232 covering the first bump 2321, the second condensation region 2302 includes the second bump 2322 and the planarization layer 232 covering the second bump 2322, and the third condensation region 2303 includes the third bump 2323 and the planarization layer 232 covering the third bump 2323.

Since the refractive index of the planarization layer 232 is less than the refractive index of the pattern layer 231, the first condensation region 2301, the second condensation region 2302, and the third condensation region 2303 mainly converge light through a light refraction principle. Described in detail, the first condensation region 2301 converges green light emitted by the first sub-pixel 212G on the curved region to a small angle, to further reduce luminance of green light of the curved region 202 at a large viewing angle, thereby reducing a phenomenon that the curved region 202 looks greenish. The flat region 201 emits light at a small viewing angle, so that the second condensation region 2302 and the third condensation region 2303 respectively converge red light and blue light to a small angle, thereby improving luminance of a red sub-pixel and a blue sub-pixel on the flat region 201. Generally, green light is strongest on the flat region 201. Therefore, improving the luminance of red light and green light may reduce luminance differences with green light.

The display panel provided in the embodiments of the present invention is a microlens structure (disposed in the first condensation region, the second condensation region, and the third condensation region) design applicable to a large-angle curved screen. By disposing the first condensation region on the first curved region sub-pixel, the luminance of the first curved region sub-pixel at a large viewing angle is reduced, thereby reducing the phenomenon that the curved region looks greenish. By respectively disposing the second condensation region and the third condensation region on the second flat region sub-pixel and the third flat region sub-pixel, the luminance of the second flat region sub-pixel and the third flat region sub-pixel may be improved, thereby further reducing the luminance differences with green light.

The display panel provided in the embodiments of the present invention may be applicable to a display apparatus. The display apparatus includes any one of the foregoing display panels, so that the display apparatus includes same beneficial effects as the foregoing display panels, and details are not described herein again.

The description of the embodiments is merely used for helping understand the technical solutions and a core idea of the present invention. A person of ordinary skill in the art should understand that modifications can be still made to the technical solutions described in the foregoing embodiments, or equivalent replacements can be made to some technical features in the technical solutions, as long as such modifications or replacements do not cause the essence of corresponding technical solutions to depart from the scope of the technical solutions of the embodiments of the present invention.

What is claimed is:

1. A display panel comprising:
a substrate, comprising a flat region and a curved region;
a plurality of sub-pixels located on the substrate, wherein the plurality of sub-pixels are distributed on the flat region and the curved region, and the plurality of sub-pixels comprise a plurality of first sub-pixels, a plurality of second sub-pixels, and a plurality of third sub-pixels, and the first sub-pixels are green sub-pixels, the second sub-pixels are red sub-pixels, and the third sub-pixels are blue sub-pixels;
a packaging layer covering the plurality of sub-pixels; and
an optical film layer located on the packaging layer, wherein the optical film layer comprises a plurality of condensation regions and a plurality of transmission regions, the plurality of condensation regions comprise a first condensation region located on the curved region and disposed corresponding to and on one of the first sub-pixels, and the plurality of transmission regions comprise a first transmission region located on the flat region and disposed corresponding to and on one of the first sub-pixels; and the optical film layer comprises a pattern layer located on the packaging layer and a planarization layer located on the pattern layer;
wherein the plurality of condensation regions comprise a plurality of first condensation regions disposed on corresponding ones of the first sub-pixels in the curved region, a plurality of second condensation regions disposed on corresponding ones of the second sub-pixels in the flat region, a plurality of third condensation regions disposed on corresponding ones of the third sub-pixels in the flat region, a plurality of fourth condensation regions disposed on corresponding ones of the second sub-pixels in the curved region, and a plurality of fifth condensation regions disposed on corresponding ones of the third sub-pixels in the curved region;
the pattern layer is provided with a plurality of first grooves, a plurality of second grooves, a plurality of third grooves, a plurality of fourth grooves, and a plurality of fifth grooves disposed in the first condensation regions, the second condensation regions, the third condensation regions, the fourth condensation regions, and the fifth condensation regions, respectively; and the planarization layer comprises a plurality of first filling structures respectively filled in corresponding ones of the first grooves, a plurality of second filling structures respectively filled in corresponding ones of the second grooves, a plurality of third filling structures respectively filled in corresponding ones of the third grooves, a plurality of fourth filling structures respectively filled in corresponding ones of the fourth grooves, and a plurality of fifth filling structure respectively filled in corresponding ones of the fifth grooves; and in a direction towards the flat region, areas of the first filling structures in a plane parallel to the substrate gradually decrease, areas of the fourth filling structures in the plane parallel to the substrate gradually increase, and areas of the fifth filling structures in the plane parallel to the substrate gradually increase.

2. The display panel as claimed in claim 1, wherein an area of at least one of the first sub-pixels is smaller than an area of at least one of the second sub-pixels, and the area of the at least one of first sub-pixels is smaller than an area of at least one of the third sub-pixels; and the plurality of transmission regions further comprise a second transmission region and a third transmission region located on the curved region and respectively disposed corresponding to one of the second sub-pixels and one of the third sub-pixels; the second transmission region is disposed on the one of the second sub-pixels, and the third transmission region is disposed on the one of the third sub-pixels.

3. The display panel as claimed in claim 1, wherein the first sub-pixels generate a green light source.

4. The display panel as claimed in claim 1, wherein the second sub-pixels generate a red light source.

5. The display panel as claimed in claim 1, wherein the third sub-pixels generate a blue light source.

6. The display panel as claimed in claim 1, wherein
the planarization layer is in direct contact with the pattern layer, wherein a refractive index of the planarization layer is greater than a refractive index of the pattern layer.

7. The display panel as claimed in claim 6, wherein the refractive index of the pattern layer ranges from 1.3 to 1.6, and the refractive index of the planarization layer ranges from 1.5 to 1.9.

8. The display panel as claimed in claim 6, wherein a projection shape of at least one of the sub-pixels on the substrate is same as a projection shape of corresponding one of the filling structures on the substrate.

9. The display panel as claimed in claim 6, wherein a shape of at least one of the sub-pixels comprises one of a four-angle star, an ellipsoid, a diamond, a square, a circle, or a long stick; and a shape of at least one of the filling structures in a top view direction is a circle, and a diameter of the at least one of the filling structures is greater than a diameter of an inscribed circle of corresponding one of the sub-pixels and is less than a diameter of a circumscribed circle of the corresponding one of the sub-pixels.

10. The display panel as claimed in claim 6, wherein the pattern layer and the planarization layer are made of transparent materials.

11. The display panel as claimed in claim 10, wherein the pattern layer comprises epoxy and acrylic organic materials and inorganic materials; and wherein the planarization layer comprises organic materials doped with nano particles and organic-inorganic hybrid materials.

12. The display panel as claimed in claim 1, wherein an area of each of the first sub-pixels is smaller than an area of each of the second sub-pixels and smaller than an area of each of the third sub-pixels; and wherein an orthographic projection shape of each of the first sub-pixels on the substrate is same as an orthographic projection shape of the first filling structure on the substrate, an orthographic projection shape of each of the second sub-pixels is same as an orthographic projection shape of the second filling structure on the substrate, and an orthographic projection shape of each of the third sub-pixels is same as an orthographic projection shape of the third filling structure on the substrate.

13. The display panel as claimed in claim 1, wherein
the plurality of transmission regions comprise a plurality of first transmission regions disposed on corresponding ones of the first sub-pixels in the flat region, a plurality of second transmission regions disposed on corresponding ones of the second sub-pixels in the curved region, and a plurality of third transmission regions disposed on corresponding ones of the third sub-pixels in the curved region; and the planarization layer is in direct contact with the pattern layer, wherein a refractive index of the planarization layer is greater than a refractive index of the pattern layer.

* * * * *